US012245362B2

(12) United States Patent
Fackler et al.

(10) Patent No.: US 12,245,362 B2
(45) Date of Patent: Mar. 4, 2025

(54) EMC FILTER FOR A CONTROL DEVICE

(71) Applicant: Robert Bosch GmbH, Stuttgart (DE)

(72) Inventors: Rupert Fackler, Pleidelsheim (DE); Stefan Heimburger, Willstaett-Legelshurst (DE); Michel Gross, Dusslingen (DE)

(73) Assignee: Robert Bosch GmbH, Stuttgart (DE)

( * ) Notice: Subject to any disclaimer, the term of this patent is extended or adjusted under 35 U.S.C. 154(b) by 159 days.

(21) Appl. No.: 18/043,478

(22) PCT Filed: Jul. 19, 2021

(86) PCT No.: PCT/EP2021/070153
§ 371 (c)(1),
(2) Date: Feb. 28, 2023

(87) PCT Pub. No.: WO2022/042946
PCT Pub. Date: Mar. 3, 2022

(65) Prior Publication Data
US 2023/0328874 A1  Oct. 12, 2023

(30) Foreign Application Priority Data
Aug. 31, 2020  (DE) .................... 10 2020 210 966.4

(51) Int. Cl.
*H05K 1/02* (2006.01)
*H05K 1/16* (2006.01)

(52) U.S. Cl.
CPC ......... *H05K 1/0218* (2013.01); *H05K 1/0271* (2013.01); *H05K 1/162* (2013.01); *H05K 2201/09309* (2013.01); *H05K 2201/10409* (2013.01)

(58) Field of Classification Search
CPC ..... H05K 1/0218; H05K 1/0271; H05K 1/162
See application file for complete search history.

(56) References Cited

U.S. PATENT DOCUMENTS 6,333,857 B1  12/2001  Kanbe et al.
2010/0033893 A1  2/2010  Dolfi et al.

FOREIGN PATENT DOCUMENTS

DE  102008000976 A1  10/2009
EP       0704869 A1   4/1996
WO     2015190424 A1  12/2015

OTHER PUBLICATIONS

Translation of International Search Report for Application No. PCT/EP2021/070153 dated Nov. 24, 2021 (2 pages).

*Primary Examiner* — Jeremy C Norris
(74) *Attorney, Agent, or Firm* — Michael Best & Friedrich LLP

(57) ABSTRACT

The invention relates to an EMC filter for a control device. The filter includes a multilayer circuit carrier comprising electrically conductive layers, in particular copper layers, and electrically insulating circuit board layers. According to the invention, the circuit carrier of the aforementioned type forms at least two filter capacitors, wherein in each case the filter capacitors are formed by electrically conductive layers that are formed in the circuit carrier and lie across from one another and/or extend parallel at a distance from each other.

11 Claims, 3 Drawing Sheets

EMC FILTER FOR A CONTROL DEVICE

BACKGROUND OF THE INVENTION

A multilayer circuit board is known from DE 10 2008 000 976 A1, which comprises means for increasing electromagnetic compatibility. The means comprises at least one coupling impedance having at least one Ohm's resistance.

SUMMARY OF THE INVENTION

According to the invention, the circuit carrier of the aforementioned type forms at least two filter capacitors, wherein in each case the filter capacitors are formed by electrically conductive layers that are formed in the circuit carrier and lie across from one another and/or extend parallel at a distance from each other. Advantageously, the filter can thus be provided in a cost-effective manner, formed by an in particular naked circuit carrier.

In a preferred embodiment, the capacitors each comprise a common electrode that, together with at least one or only one further electrode, forms a capacitance of the capacitor. Advantageously, multiple capacitors can thus be configured in a space-saving manner in the circuit carrier.

Preferably, the capacitors are respectively formed by at least two electrically conductive layers lying parallel at a distance from one another, which are separated from each other by an electrically insulating layer. Advantageously, the filter can thus be provided in a cost-effective manner by a layer stack formed from prepreg laminates.

Preferably, the circuit carrier—in particular in its flat extension—has a surface region for each capacitor, wherein the capacitor is formed in a layer stack covered by the surface region.

Further preferably, the capacitor is formed by the electrodes, which are arranged in the layer stack and formed by an electrically conductive layer and lie across from one another, and electrically insulating circuit board layers separating said electrodes from one another. Advantageously, multiple capacitors can thus be formed in the circuit carrier adjacent to one another as separate spatial regions of the circuit carrier.

In a preferred embodiment, the filter is configured so as to suppress common-mode interference, wherein at least one capacitor is configured as a Y-capacitor. Advantageously, such a common-mode filter can be provided in a cost-effective manner.

In a preferred embodiment, the filter is configured so as to suppress differential-mode interference, wherein at least one capacitor is configured as an X-capacitor. Advantageously, such a differential-mode filter can be provided in a cost-effective manner by a circuit carrier.

In a preferred embodiment, the filter comprises at least one Y-capacitor and at least one X-capacitor. Advantageously, the circuit carrier can thus be configured in a cost-effective manner so as to eliminate common-mode and differential-mode interference.

In a preferred embodiment, the filter comprises a positive terminal, a negative terminal, and a ground terminal, wherein the filter comprises an X-capacitor, which is connected in parallel to the positive terminal and the negative terminal, and at least one Y-capacitor, which is connected in parallel to the negative terminal or the positive terminal and the ground terminal. Preferably, a further Y-capacitor is connected in parallel to the positive terminal and the ground terminal. The filter thus comprises two Y-capacitors and one X-capacitor. Advantageously, an interference suppression filter for common-mode and differential-mode suppression by an in particular naked circuit carrier can be provided.

In a parallel circuit of a capacitor, in particular a Y-capacitor, to electrical terminals, the electrode of the capacitor is connected to the first terminal, in particular the ground terminal, and a further electrode of the capacitor is connected to the further terminal, in particular the negative terminal. Advantageously, the filter can thus be formed in a cost-effective manner by an in particular naked circuit board.

In a preferred embodiment, the filter is formed free of components. The filter thus advantageously does not comprise any separate electronic components, which are connected to the circuit carrier by means of a through-hole assembly, also known as a through-hole technology (THT), or by surface assembly, also known as a surface-mounted device (SMD). The capacitors formed in the circuit carrier are each formed by electrically conductive layers of the multilayer circuit carrier that extend parallel to each other and are separated from each other by an electrically insulating layer. The circuit carrier itself thus embodies a circuit forming the capacitors through the inner layer structure of the electrically conductive layers.

Preferably, the filter comprises at least one electrode formed by an electrically conductive layer, which electrode is arranged parallel at a distance from an electrode of a capacitor and comprises its potential. Advantageously, a field reinforcement of the capacitor field can be formed by the electrode conducting the same potential.

In a preferred embodiment, the fluid is configured so as to be solder-free. Advantageously, the filter can thus be used in particularly high ambient temperatures.

In a preferred embodiment, the filter comprises screw terminals or plug terminals for electrically connecting and/or mechanically connecting the filter. Preferably, the screw terminal is formed by an electrically conductive layer in the region of an aperture for a screw. Advantageously, the filter can thus be screwed in the region of a connection socket in a cost-effective manner in a housing, in particular a control device housing.

In a preferred embodiment, the circuit carrier is a fiber-reinforced circuit board, in particular an epoxy resin circuit board. Advantageously, the filter can thus be provided in a cost-effective manner by a circuit board, in particular a FR4 circuit board.

In a further embodiment, the circuit carrier is a ceramic circuit carrier, in particular an LTCC (low-temperature co-fired ceramics) or a HTCC (high-temperature co-fired ceramics) circuit carrier. Advantageously, the filter can thus be used in particularly high ambient temperatures, in particular greater than 150 degrees Celsius.

The invention also relates to a control device for a motor vehicle, in particular an electric vehicle, or a hybrid vehicle. The control device comprises at least one or only one filter of the aforementioned type. The control device preferably comprises a housing that encloses a cavity. The filter, in particular formed by the circuit carrier, is accommodated and arranged in a region of the cavity in which, during operation of the control device, a greater temperature can be formed than in an adjacent region of the cavity. Advantageously, the filter can thus be arranged in the region of a hotspot of the control device. In the case of the circuit board as the filter, the filter can advantageously be operated at ambient temperatures of up to 140 degrees Celsius. In the case of the ceramic circuit carrier as the filter, the filter can advantageously be operated at ambient temperatures of more than 140 degrees Celsius.

BRIEF DESCRIPTION OF THE DRAWINGS

The invention will now be described in the following with reference to figures and embodiment examples. Further advantageous design variants will emerge from a combination of the features described in the figures and in the dependent claims.

DETAILED DESCRIPTION

Figure 1:
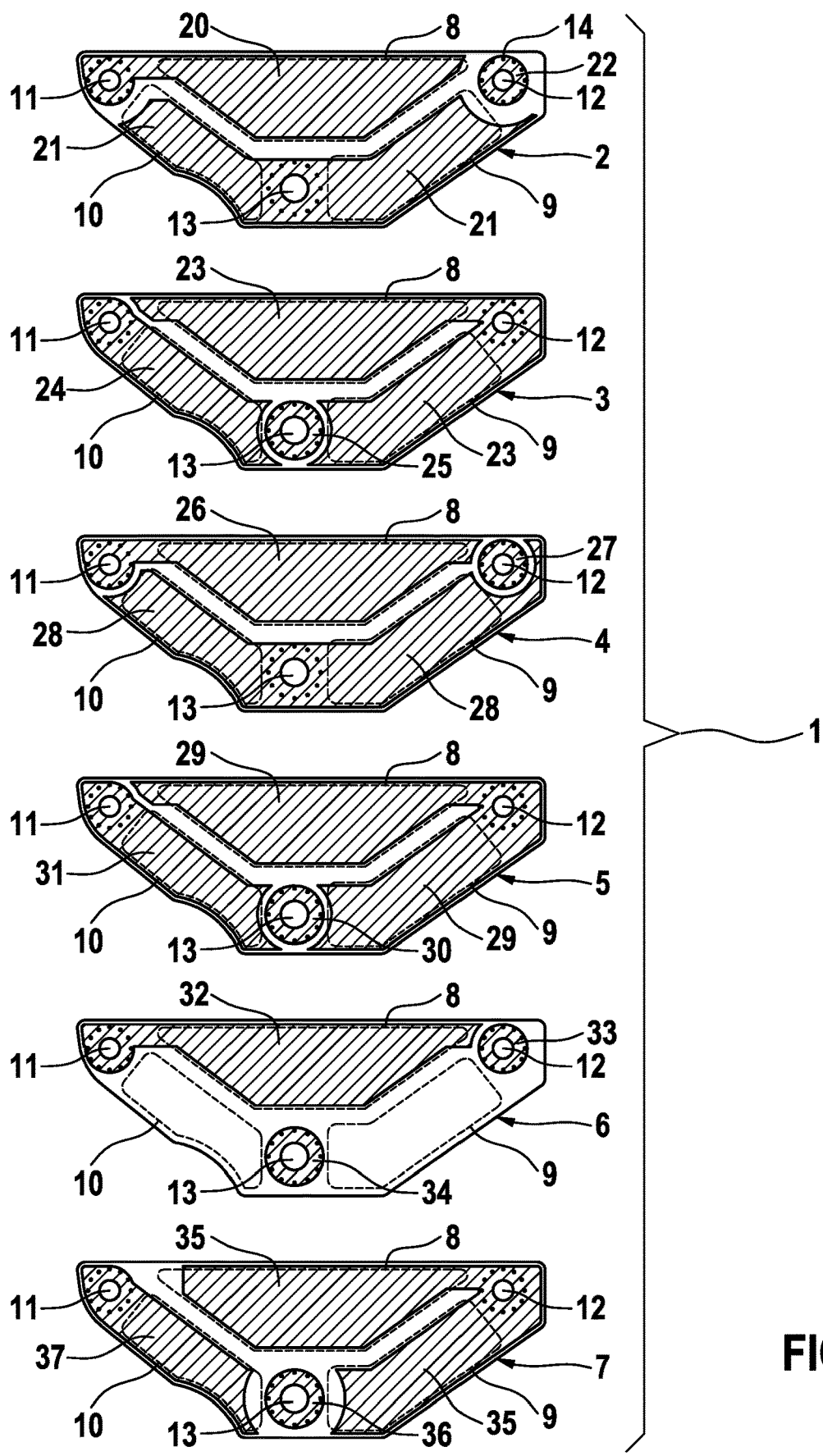
FIG. 1 shows an embodiment example of an EMV filter formed by a circuit board, in an exploded view, in which individual circuit board layers of the circuit board are shown separated from one another.

FIG. 1 shows an embodiment example of an EMV filter formed by a circuit board 1. In this embodiment example, the EMV filter 1, also referred to as a circuit board 1 in the following, is configured as a multilayer circuit board. In this embodiment example, a circuit board layer, also known as a layer, comprises at least one electrically insulating layer. At least one electrically conductive layer forming a capacitor electrode is connected to the electrically insulating layer. The electrically insulating layer is formed as a prepreg layer, in particular a fiber-reinforced epoxy resin layer.

The circuit board 1 comprises an outer circuit board layer 2. In this embodiment example, the circuit board layer 2 comprises three electrically conductive layers 20, 21, and 22. The electrically conductive layers 20, 21, and 22 are each arranged in a common plane. The layer comprises three apertures for the screw connection of the circuit board layer 2, namely an aperture 11, an aperture 12, and an aperture 13, each spaced apart from one another in a triangle formation. The apertures each form a terminal for electrically connecting the filter 1 to a busbar or screw dome.

The aperture 11 is surrounded by the electrically conductive layer 20, the aperture 12 is enclosed by the electrically conductive layer 22, and the aperture 13 is surrounded by the electrically conductive layer 21. The electrically conductive layer 22 is formed circularly in this embodiment example, in particular hollow-cylindrically, and encloses the aperture 12. In this embodiment example, the electrically conductive layer 20 is—in particular substantially—trapezoidal in shape, wherein a conductive strip layer formed in a trapezoidal corner that is formed on the layer 20 extends to and encloses the aperture 11. The electrically conductive layer 21 is arranged adjacent to the layer 20 and is U-shaped in the flat extension of the conductive strip layer 2. The electrically conductive layers 20, 21, and 22 are electrically insulated from each other. The electrically conductive layers 20 and 21 respectively form an electrode for a capacitor in each surface region.

The electrically conductive layer 20 in the region of the aperture 21 can be contacted by a screw head, which can supply a negative potential to the electrically conductive layer 20 in this embodiment example. The circuit board layer 2 can have a positive potential in the region of the aperture 12 of a screw that penetrates the aperture 12. The electrically conductive layer 21 can be brought into contact with ground potential in the region of the aperture 13 of a screw that penetrates the aperture 13, in particular its screw head. In this embodiment example, the electrically conductive layers are electrically conductively connected to electrically conductive via-connections in the region of the aperture.

The via-connections in this embodiment example are arranged radially circumferentially around the respective aperture and extend through a thickness extension of the electrically insulating layer of the circuit board layer 2. The electrically conductive layers 20, 21, and 22 can thus be electrically connected to an electrically conductive layer of a further circuit board layer supported on the circuit board layer 2 in the region of the aperture for the screw terminal.

A via 14 in the region of the aperture 12, which contacts the electrically conductive layer 22, is shown by way of example.

The electrically conductive layer 20 extends over a surface region 8 of the circuit board layer 2, and the electrically conductive layer 21 extends partially over a surface region 9 and over a surface region 10. The electrically conductive layers respectively form an electrode for a capacitor in each surface region. The electrically conductive layer extending in the surface region 9 and in the surface region 10 thus electrically connects the electrodes formed in the surface regions 9 and 10 for a capacitor. The surface regions 8, 9 and 10 are arranged at a distance from one another in the circuit board surface and forms a respective capacitor with the electrically conductive layers formed in the surface region of the layer stack covered by the surface region.

The circuit board 1 also comprises a circuit board layer 3. The circuit board layer 3 comprises an electrically conductive layer 25, which—in particular while forming an island—encloses the aperture 13. The electrically conductive layer 25 can thus conduct ground potential connected to the electrically conductive layer 21 of the circuit board layer 2 via the via-connections enclosing the aperture 13. The electrically conductive layer 23 extends up to the aperture 12 and can thus conduct a positive potential. The electrically conductive layer 23 covers the surface region 9 and thus forms an electrode in the surface region 9, in particular a positive electrode for a capacitor, in particular a plate capacitor. The electrically conductive layer 23, together with the electrically conductive layer 21 in the surface region 9, can thus form a capacitor, in particular a Y-capacitor, for common-mode suppression. The circuit board layer 3 also comprises an electrically conductive layer 24, which encloses the aperture 11, and thus can conduct a negative potential via the via-connections enclosing the aperture 11. The electrically conductive layer 24 is separate from the electrically conductive layer 23 and thus electrically insulated. The electrically conductive layer 24 can form a positive electrode for a capacitor in the surface region 10, which can form a Y-capacitor together with the electrically conductive layer 21 in the surface region 10. The electrically conductive layer 23, which can conduct the positive potential, also extends across the surface region 8 on the circuit board layer 3 and forms a capacitor electrode there, which can form an X capacitor together with the electrode 20 of the circuit board layer 2.

The circuit board 1 comprises a further circuit board layer 4 connecting to the circuit board layer 3. The circuit board layer 4 comprises a ground electrode 28 enclosing the aperture 13 and formed by an electrically conductive layer. The electrically conductive layer 28, which forms a ground electrode for two capacitors, covers the surface regions 9 and 10 in the circuit board layer 4. The circuit board layer 28 can thus form a Y-capacitor in the region of the surface region 9 together with the electrically conductive layer 23 arranged in the surface region 9 of the circuit board layer 3, which forms a positive electrode there. The electrically conductive layer 28 can form an electrode for a Y-capacitor in the surface region 10, in particular a negative Y-capacitor, which is formed by the electrically conductive layer 28 in the surface region 10 and by the electrically conductive layer 24 of the circuit board layer 3 formed in the surface region 10.

The circuit board layer 4 also comprises an electrically conductive layer 26 connecting to the aperture 11 and thus to the negative potential, covering the surface region 8, which thus forms a negative electrode for an X-capacitor. The electrically conductive layer 26 can thus form the X-capacitor in the surface region 8 together with the electrically conductive layer 23 in the surface region 8 of the circuit board layer 3.

The circuit board 1 thus comprises the circuit board layer 3, in particular the electrically conductive layers connected to the circuit board layer 3, which forms a layer stack with the adjacent circuit board layers 2 and 4. This layer stack forms a multiple capacitor in which the layer 23 forms a common electrode for adjacent capacitors.

In this embodiment example, the circuit board 1 comprises three further circuit board layers 5, 6, and 7. The circuit board layers 5, 6, and 7 each further comprise electrically conductive layers for forming electrodes for the multiple capacitor assembly formed by the circuit board 1.

The circuit board 5 comprises an electrically conductive layer 29, which extends in the surface region 9 and connects to the aperture 12, and can thus conduct positive potential. The electrically conductive layer 9 also covers the surface region 8 so that an electrode with positive potential can be formed there. The circuit board layer 5 also comprises an electrically conductive layer 31, which connects to the aperture 11 and can thus conduct negative potential. The circuit board layer 5 also comprises an electrically conductive layer 30, which annularly encloses the aperture 13 and is configured so as to pass the ground potential via the via-connections to the next electrically conductive layer.

The electrically conductive layer 29 forms a positive electrode in the surface regions 8 and 9, which can form an X-capacitor together with the electrically conductive layer 26 towards the circuit board layer 4 and can form a Y-capacitor, in particular a positively connected Y-capacitor, in the surface region 9 together with the electrically conductive layer 28. The circuit board layer 5 is connected laminarly to a circuit board layer 6. The circuit board layer 6 only comprises an electrode 32 in the region of the surface region 8, which connects to the negative potential in the region of the aperture 11. The surface regions 9 and 10 do not have an electrode in the circuit board layer 6. The circuit board layer comprises, in the region of the aperture 12, an electrically conductive layer 33 enclosing the aperture 12 for passing the positive potential and an electrically conductive layer 34 enclosing the aperture 13 for passing the ground potential.

The circuit board 1 also comprises an outer circuit board layer 7 formed from the circuit board layers. The circuit board layer 7 comprises an electrically conductive layer 35, which connects to the positive potential in the region of the aperture 9 and covers the surface region 8 and the surface region 9. The electrically conductive layer 35, along with the electrically conductive layer 32 of the circuit board layer 6, can thus form an X-capacitor.

The electrically conductive layer 35 can form a positive electrode in the surface region 9, which, together with the positive electrode in the same surface region of the circuit board layer 5, can strengthen the field of the positive electrode formed therein.

The circuit board layer 7 comprises an electrically conductive layer 37 in the region of the surface region 10, which connects to the negative potential in the region of the aperture 11, and can thus form a negative electrode. The negative electrode of the circuit board layer 7 can act in a field-reinforcing manner in the surface region 10 for the negative electrode of the circuit board layer 5.

Layer stacks are thus formed in the surface regions 8, 9, and 10, in which capacitors are respectively connected in parallel to one another, transversely to the flat extension of the circuit board layers 2, 3, 4, 5, 6, and 7. A multilayer X-capacitor is thus formed in the surface region 8 of the circuit board 1, and a multilayer positive Y-capacitor is formed in the surface region 9, which Y-capacitor connects to the ground potential and the positive potential, and a negative Y-capacitator is formed in the surface region 10, which Y-capacitator connects to the ground potential and the negative potential.

Figure 2:
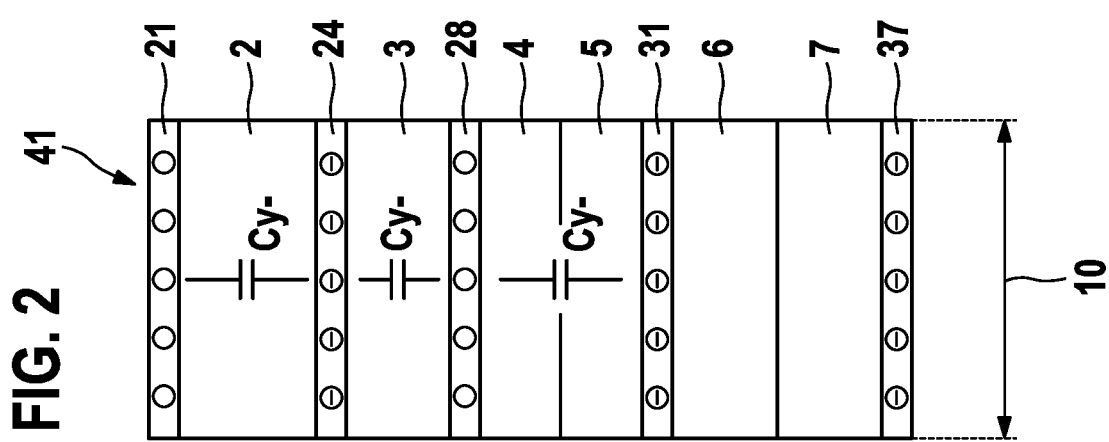
FIG. 2 shows three partial volumes of the circuit board shown in FIG. 1, in which a capacitor is respectively formed.
Figure 2:
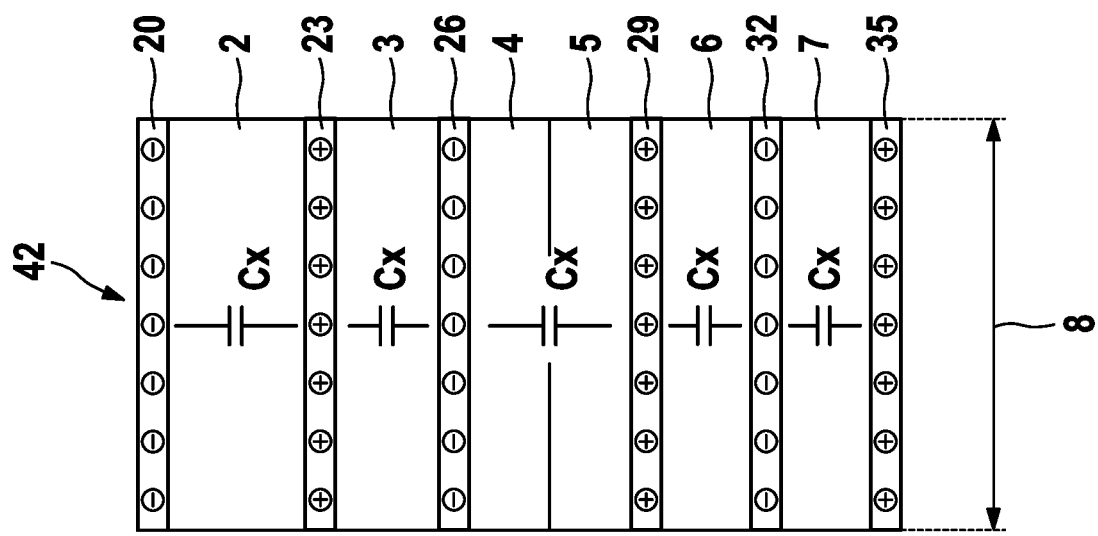
Figure 2:
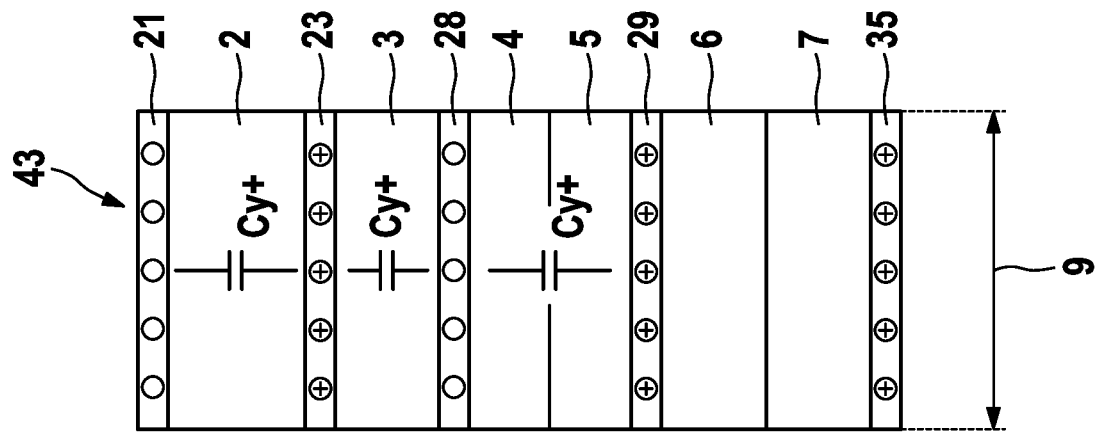

FIG. 2 shows—schematically—the layer stack 41, 42, and 43 in the surface regions 8, 9, and 10 in a cross-sectional view of the respective circuit board layers already described in FIG. 1. The circuit board 1 forms a layer stack 42 in the surface region 8 comprising the circuit board layers 2, 3, 4, 5, 6, and 7, which form an X-capacitor in the surface region 8.

The circuit board layer 2 comprises an electrically insulating layer, which is connected to the electrically conductive layer 20. The circuit board layer 3 comprises an electrically insulating layer, which is connected to the electrically conductive layer 23. The electrically conductive layers 20 and 23 respectively form an electrode for an X capacitor. The electrically conductive layers 26, 29, 32, and 35 connecting to the layer stack 42 are each alternately configured so as to have a negative or a positive potential, such that a plate capacitor field can be formed between the thusly formed electrodes via the electrically insulating layers forming a dielectric material.

In this embodiment example, the layer stack 43 in the region of the surface region 9 comprises three positive Y-capacitors formed between the layers 21, 23, 28, and 29, which are successively separated by electrically insulating layers in the layer sequence. The electrically conductive layers 21 and 28 each conduct ground potential, enclosing the electrically conductive layer 23, which can conduct positive potential, between each other. The positive potential-conducting layers 23 and 29 enclose the ground potential-conducting layer 28 between each other. In this way, three Y-capacitors can be arranged in the layer stack 43 in the surface region 9 above one another.

In the surface region 10, a layer stack 41 is formed, which forms negative Y-capacitors that are connected to negative potential and ground potential. A Y-capacitor is formed between the electrically conductive layers 21 and 24, and another Y-capacitor is formed between the negative potential-conducting electrically conductive layer 24 and the ground potential-conducting layer 28. The electrically conductive layers 24 and 31, respectively configured so as to conduct negative potential, enclose the electrically conductive layer 28 between each other, wherein the electrically conductive layer 28 is configured so as to conduct ground potential. In this way, a Y-capacitor is formed on both sides transverse to the flat extension of the electrically conductive ground layer 28, which leads to the negative potential.

The electrically conductive layer 37, which is configured so as to conduct negative potential, can amplify the field of the electrically conductive layer 31. In the layer stack 43 in the surface region 9, the electrically conductive layer 35 can conduct positive potential and can thus act in a field-enhancing manner for the electrically conductive layer 29.

The electrically conductive layers 29 and 31 can each serve as extended electrode surfaces to increase the capacitance of the respective capacitor in a supplemental manner. Advantageously, by a spatial distribution of the capacities in the layer stack, a self-resonant filter can be avoided.

Figure 3:
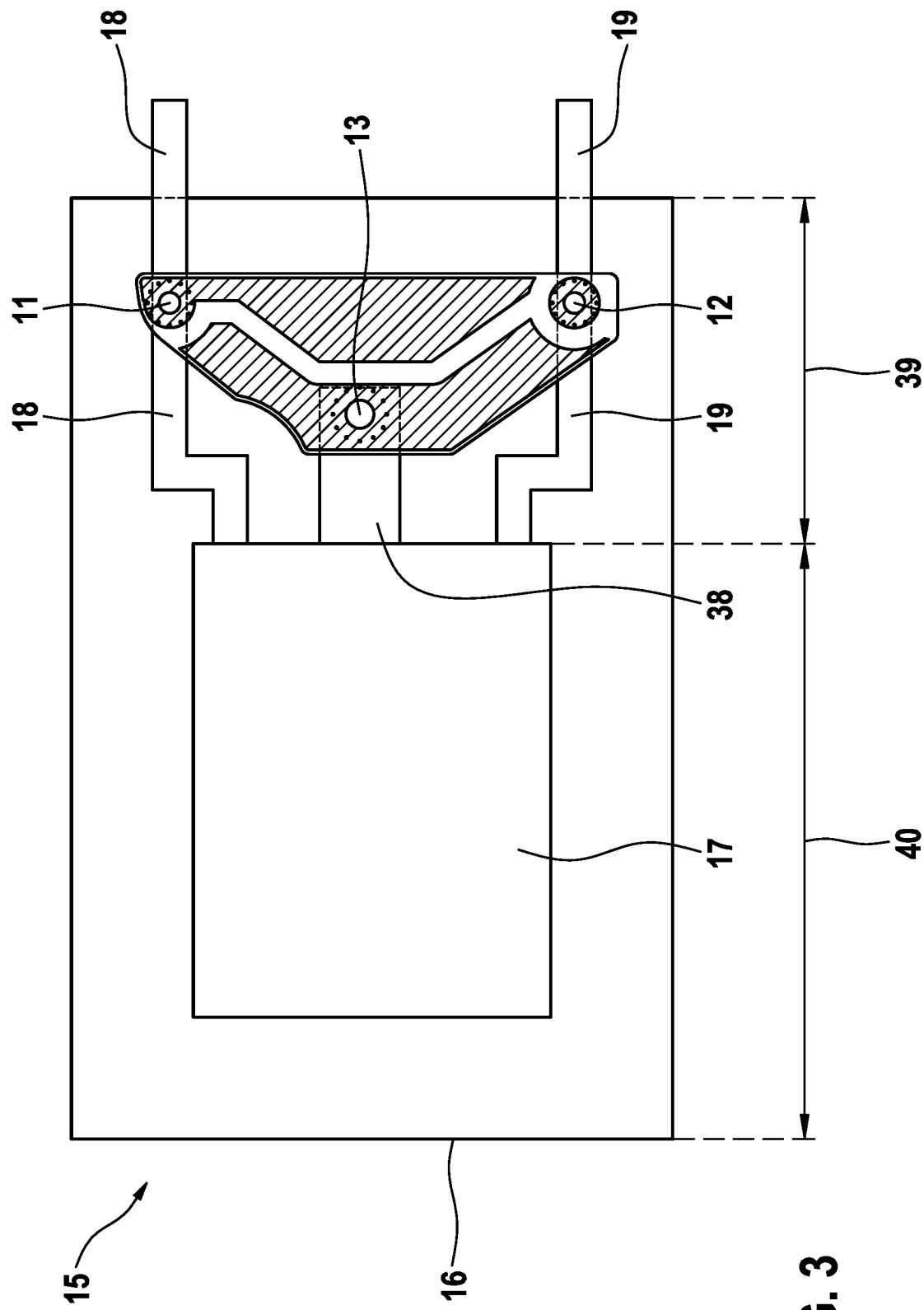
FIG. 3 shows an embodiment example for a control device having an EMV filter according to FIG. 1.

FIG. 3 shows an embodiment example for a control device 15. The control device 15 comprises a housing 16. In this embodiment example, the housing 16 encloses a cavity in which a power module, in particular an inverter 17, is arranged. The inverter 17 comprises power semiconductor switches configured so as to power an electric machine for generating a rotating field.

The inverter 17 is connected to a negative busbar 18 on the input side and can receive negative potential therefrom. The inverter 17 is connected to a positive busbar 19, which protrudes from the housing 16 with an end portion, and via which the inverter 17 can be connected to a positive supply potential. The inverter 17 is also connected to a ground busbar 38, which is connected to ground potential, in particular to the housing 16. The housing 16 is a metal housing, for example, in particular an aluminum housing.

The busbars 18 and 19 form an electrical terminal on the input side for the control device 15.

In this embodiment example, the control device 15 comprises an EMV filter 1, which—as already explained in FIG. 1 and in FIG. 2—comprises a negative Y-capacitor, a positive Y-capacitor, and an X-capacitor. In this design example, the apertures of the filter 1 respectively cover one of the busbars, such that the filter 1 can be screwed to the busbar covering it in the region of an aperture and can receive the potential of the respective busbar there. The filter 1 is connected to the negative busbar 18 in the region of the aperture 11. The filter 1 is connected to the positive busbar 19 in the region of the aperture 12. The filter 1 is connected to the ground potential-conducting busbar 38 in the region of the aperture 13. The electrical connection can be formed, for example, by an electrically conductive connecting means, for example a swaging rivet, or a screw.

Busbars 18 and 19 can become particularly hot as the inverter 17 is powered. The control device 15 can thus develop a high temperature in the region 39 of the housing 16, in which the busbars 18 and 19 enter the housing 16.

The EMV filter 1, formed by a multilayer circuit board, is advantageously configured as being free of soldering medium in this embodiment example, or additionally free of components. Advantageously, no soldering means on the multilayer circuit board forming the EMC filter 1 can thus melt during operation of the control device 15. All capacitors inherently formed in the EMC filter 1 by electrically conductive layers of the multilayer circuit board therefore cannot be damaged by the high temperature in the region 39 of the control device 15, insofar as they are not formed by discrete components soldered to a circuit carrier. The control device 15 is configured so as to form a smaller temperature than in the input region 39 into which the busbars 18 and 19 lead during operation in a region 40 connected to the region 39 in the housing 16 in which the inverter 17 is arranged. The control device 15 can thus comprise circuit carriers in the region 14, and thus in the region of the inverter 17, which are soldered with soldering means, and thus fitted on, electronic components.

The invention claimed is:

1. An EMC filter (1) for a control device (15),
wherein the filter (1) includes a multilayer circuit carrier (1) comprising electrically conductive layers (20, 21, 23, 24, 26, 28, 29, 31, 32, 35, 37) and electrically insulating layers (2, 3, 4, 5, 6, 7),
wherein
the circuit carrier (1) forms at least two filter capacitors (8, 9, 10), wherein the filter capacitors (8, 9, 10) are respectively formed by at least two electrically conductive layers (20, 23, 26, 29, 32, 35) that are formed in the circuit carrier (1) and lie across from one another and/or extend parallel at a distance from each other.

2. The filter (1) according to claim 1,
wherein
the capacitors (8, 9, 10) each comprise a common electrode (23, 26, 29, 32), which forms a capacitance of the capacitor (8, 9, 10) with a respective further electrode (20, 23, 26, 29, 32, 35).

3. The filter (1) according to claim 1,
wherein
the circuit carrier (1) for each capacitor has a surface region (8, 9, 10), wherein, in a stack (41, 42, 43) of the circuit carrier (1) covered by the surface region (8, 9, 10), the capacitor is formed by the electrodes (20, 23, 26, 29, 32, 35), which are arranged in the layer stack (41, 42, 43) and formed by an electrically conductive layer and lie across from one another, and electrically insulating circuit board layers (2, 3, 4, 5, 6, 7) separating said electrodes from one another.

4. The filter (1) according to claim 1,
wherein
the filter is configured so as to suppress common-mode interference, wherein at least one capacitor is configured as a Y-capacitor (9, 10, 41, 43).

5. The filter (1) according to claim 1,
wherein
the filter is configured so as to suppress differential-mode interference, wherein at least one capacitor is configured as an X-capacitor (8, 42).

6. The filter (1) according to claim 1,
wherein
the filter (1) comprises a positive terminal (12), a negative terminal (11), and a ground terminal (13), wherein the X-capacitor is connected in parallel to the positive terminal and the negative terminal and the Y-capacitor is connected in parallel to the negative terminal (11) or the positive terminal (12) and the ground terminal (13).

7. The filter (1) according to claim 1,
wherein
the filter (1) is configured so as to be solder-free.

8. The filter (1) according to claim 1,
wherein
the filter (1) comprises screw terminals (11, 12, 13) or plug terminals for electrically connecting the filter (1).

9. The filter (1) according to claim 1,
wherein
the circuit carrier is a fiber-reinforced circuit board.

10. The filter (1) according to claim 1,
wherein
the filter (1) comprises at least one electrode (35, 37) formed by an electrically conductive layer, which electrode is arranged parallel at a distance from an electrode (31, 29) of a capacitor (28, 29, 28 31) and comprises its potential.

11. A control device (15) for a motor vehicle, in particular an electric vehicle, having a filter (1) according to claim 1, wherein
the control device (15) comprises a housing (16) enclosing a cavity, and the filter (1) is accommodated and arranged in a region (39) of the cavity in which, during operation of the control device (15), a greater temperature can be formed than in an adjacent region (40) of the cavity.

\* \* \* \* \*